(12) United States Patent
Lu

(10) Patent No.: US 11,665,859 B2
(45) Date of Patent: May 30, 2023

(54) HEAT DISSIPATION CONDUCTIVE FLEXIBLE BOARD

(71) Applicant: G2F Tech Co., Ltd., Taipei (TW)

(72) Inventor: Jie-Qi Lu, Taipei (TW)

(73) Assignee: G2F TECH CO., LTD., Taipei (TW)

( * ) Notice: Subject to any disclaimer, the term of this patent is extended or adjusted under 35 U.S.C. 154(b) by 51 days.

(21) Appl. No.: 17/349,573

(22) Filed: Jun. 16, 2021

(65) Prior Publication Data

US 2022/0151107 A1    May 12, 2022

(30) Foreign Application Priority Data

Nov. 11, 2020 (TW) .................................. 109139245

(51) Int. Cl.
*H05K 7/20* (2006.01)
*H05K 1/05* (2006.01)

(52) U.S. Cl.
CPC ......... *H05K 7/20509* (2013.01); *H05K 1/056* (2013.01)

(58) Field of Classification Search
CPC ..................................................... H05K 1/056
See application file for complete search history.

(56) References Cited

U.S. PATENT DOCUMENTS

| 8,143,631 B2 * | 3/2012 | Crandell | H05K 1/189 |
| | | | 257/E33.059 |
| 2017/0367175 A1 * | 12/2017 | Lai | H05K 1/0203 |
| 2021/0321509 A1 * | 10/2021 | Jung | F21S 41/151 |

FOREIGN PATENT DOCUMENTS

| TW | 201011936 A | 3/2010 |
| TW | I487073 B | 6/2015 |
| TW | 201627255 A | 8/2016 |
| TW | M536989 U | 2/2017 |
| TW | 201927084 A | 7/2019 |

* cited by examiner

*Primary Examiner* — Mukundbhai G Patel
(74) *Attorney, Agent, or Firm* — Muncy, Geissler, Olds & Lowe, P C.

(57) ABSTRACT

The present invention provides a heat dissipation conductive flexible board, which is assembled from: at least a single layer thin board, the structure of which includes a first conductive thin layer and a first functional thin layer, and at least a double layer thin board, the structure of which includes a second conductive thin layer, a second functional thin layer, and a third functional thin layer. A spraying, coating, or printing method is used to manufacture the single layer thin board and the double layer thin board; after which the single layer thin board and the double layer thin board are laminated together to form the heat dissipation conductive flexible board having a multi-layer conductive structure.

7 Claims, 4 Drawing Sheets

HEAT DISSIPATION CONDUCTIVE FLEXIBLE BOARD

BACKGROUND OF THE INVENTION

(a) Field of the Invention

The present invention relates to a flexible substrate having application in high frequency electronic components, and is provided with heat dissipation and conductivity characteristics. In particular, the heat dissipation conductive flexible board is provided with high heat dissipation and thinness characteristics, thereby solving the unsolvable problems of miniaturization or thinness of high heat generating electronic components.

(b) Description of the Prior Art

Present day electronic and communication products have already become necessities of life for people. And under the conditions demanding high-speed transmission, high processing effectiveness, and the trend for thinness, pliable flexible substrates are already heavily used in a variety of electronic devices. However, the heat dissipation effect of current flexible circuit boards is inferior, and if the circuit board is connected to high heat generating electronic components, then, a traditional ceramic rigid board or aluminum rigid board must still be connected to the flexible substrate to solve the high temperature heat dissipation problem. A flexible circuit board is used to mount traditional low heat generating chips or low heat generating electronic components; however, if a rigid circuit board is mounted with high heat generating chips or electronic components, then they are generally connected to a flexible circuit board connection pad. And, currently, traditional flexible substrates are still only mostly used where electrical conductivity is required. Hence, further developmental research is required if there is a need to mount high heat generating chips or high heat generating electronic components. Heat is generated when chips or electronic components are operating, and temperature builds up in the chips or electronic components, thus, the connection areas between the flexible circuit board connection pad and the chips or electronic components easily deteriorate because of the high temperature, easily resulting in operating failure. Furthermore, temperature build-up on the flexible circuit board brings about a decrease in the effectiveness of the electronic components. In addition, the high temperature resulting from the millimeter wave, high frequency transmission of the recent hotly debated, next generation 5G communication protocol causes the chips to reach a high temperature of 200° C. Hence, there is a great need for technology that overcomes the obstacles in producing electronic materials able to resist such high temperatures.

As for research in the prior art regarding flexible circuit board structure mounted with heat generating components, Taiwan Patent No. TW201927084A discloses a flexible circuit board structure suitable for mounting heat generating components, comprising a flexible substrate and at least one heat conduction through hole. The flexible substrate is composed of an insulating layer, a first patterned metallic foil layer, and a second patterned metallic foil layer, wherein the first patterned metallic foil layer and the second patterned metallic foil layer are respectively disposed on the two corresponding surfaces of the insulating layer. The heat generating components are appropriately mounted on the first patterned metallic foil layer, with the thickness of the second patterned metallic foil layer being greater than the thickness of the first patterned metallic foil layer. The heat conduction through hole penetrates the flexible substrate and thermally couples the heat generating components.

As for research in the prior art regarding rigid ceramic copper foil substrates, Taiwan Patent No. TW201011936A discloses a light emitting diode and manufacturing process thereof, which uses high temperature metal lamination and yellow light micro lithography technology to prepare a ceramic copper foil substrate. A light-emitting diode circuit is then formed through a die attachment and wire bonding manufacturing process or flip chip technology. Finally, encapsulation material, such as an epoxy, a silicone resin, or silicone gel, is used to encapsulate the light-emitting diode by means of transfer molding or injection molding methods.

In addition, further research in the prior art regarding flexible ceramic substrates reveals Taiwan Patent No. TWI487073B, which discloses a flexible ceramic substrate, which primarily uses a flexible substrate made from a ceramic powder compound. The substrate layer thickness lies between copper foil base materials of specified thickness to serve as an etched circuit board for circuit use. A ceramic compound layer is provided on the surface of the metal substrate, wherein the ceramic compound layer consists of a mixture of a specified proportion by weight of a ceramic powder and a glue. The ceramic compound layer uses the glue to cover the crystal interstices in the ceramic powder layer, thereby adhering together the ceramic powder to form the flexible ceramic compound layer of predetermined thickness and adhering the ceramic powder to the metal substrate, to enable mounting heat generating components, as well as conducting and dissipating heat emitting from the heat generating components.

Further research in the prior art regarding flexible ceramic heat dissipation plates reveals Taiwan Patent No. TW201627255A, which discloses a flexible ceramic heat dissipation plate, which is primarily produced by first mixing a highly pure carborundum powder with a low temperature bonding agent, after which preform molding and baking is carried out to form a basic substrate material, The aforementioned low temperature bonding agent is an epoxy resin with flexible and resilient characteristics, which provides the basic substrate material with a flexibility function and the ability to be easily cut and machine processed. Moreover, with the addition of the low temperature bonding agent, resin hardening is used to effectively remove resultants or oxides produced during the high temperature sintering process, thereby manufacturing the flexible ceramic heat dissipation plate of the present invention with the preferred heat dissipation effect.

Hence, comprehensive research in flexible ceramic heat dissipation plates of the prior art has shown that they are complicated and unable to solve the problems of manufacturing ever larger products. Thus, the inventor of the present invention submitted the Taiwan patent application No. TWM536989U, which discloses a large area ceramic substrate structure, comprising: a copper foil layer, which is disposed close to heat generating components, a ceramic layer, and a heat conducting layer. The present invention is characterized in using the high heat conduction and high insulation characteristics of the ceramic layer to separate the copper foil layer from the heat conducting layer, thereby protecting the conducting circuit of the copper foil layer. And further uses the high heat conduction characteristic of the heat conducting layer to uniformly carry away the heat energy from the heat generating components, to achieve a superior heat dissipation function.

SUMMARY OF THE INVENTION

The inventor of the present invention fully understands the difficulty in manufacturing products of large area from current flexible substrates, and the current reel to reel method is still unable to increase the speed of large area production lines, even more so when producing large area heat dissipation conductive flexible substrates. The lamination and contraposition manufacturing process of flexible substrate material of the prior art is complicated and the production rate is relatively slow, and the introduction of ceramic heat dissipation material into the structure easily produces cracks during production and in use. Hence, current technology is unable to provide a breakthrough in the inadequate heat conduction and easy fracturing problems. The present invention is able to produce large area heat conduction conductive flexible substrate structures, which are provided with a single layer thin board and double layer template having a standardized basis, enabling selective assembly according to functional requirements. With regard to the increasing importance of small-volume large-variety product development, the present invention provides a higher degree of freedom and material combination. The present invention provides a heat dissipation conductive flexible board that has an assembly comprising: at least a single layer thin board, the structure of which comprises: a first conductive thin layer, having a thickness that lies between 0.1 micrometers~5 millimeters, and is laminated to a first functional thin layer, which is a ceramic material, graphene material or a glue material; and at least a double layer thin board, the structure of which comprises: a second conductive thin layer, having a thickness that lies between 0.1 micrometers~5 millimeters, and is laminated between a second functional thin layer and a third functional thin layer. The second functional thin layer is a ceramic material, graphene material, or a glue material; and the third functional thin layer is a ceramic material, graphene material or a glue material. The present invention is characterized in that it uses at least a spraying, a coating, and a printing method to manufacture the single layer thin board and the double layer thin board, after which the single layer thin board and the double layer thin board are laminated together to form the heat dissipation conductive flexible board having a multi-layer conductive structure. The materials for the first conductive thin layer and the second conductive thin layer are at least copper foil, aluminum foil, silver paste, carbon nanotubes, electrically conductive ink, tin paste, or copper paste. The first conductive thin layer and the second conductive thin layer are provided with electrically conducting circuit patterns to enable electrical conductance. At least the first functional thin layer, the second functional thin layer, or the third functional thin layer is a ceramic material, the thickness of which is 0.1~100 micrometers. At least the first functional thin layer, the second functional thin layer, or the third functional thin layer is a graphene material, the thickness of which is 0.1~100 micrometers. At least the first functional thin layer, the second functional thin layer, or the third functional thin layer is glue material, the thickness of which is 0.1~100 micrometers. The single layer thin board and the double layer thin board are laminated together using a large area reel to reel configuration or sheet to sheet configuration; moreover, the width of the reel material or the sheet material is greater than or equal to 125 millimeters. The total thickness of the heat dissipation conductive flexible board is greater than or equal to 25 micrometers. Furthermore, the heat dissipation conductive flexible board can be directly cut and applied as composite cooling fins, wherein the non-functional edges of the composite cooling fins are exposed to the external environment to provide heat dissipation areas required for heat dissipation. The heat dissipation conductive flexible board can also be directly cut and applied as bendable three-dimensional composite cooling fins, wherein the non-functional edges of the bendable three-dimensional composite cooling fins are exposed to the external environment to provide heat dissipation areas required for three-dimensional heat dissipation. The present invention is provided with the characteristics of flexibility, arbitrary combination assembly, and simplification of the manufacturing process, thereby distinguishing and differentiating it from the prior art. Accordingly, the originality, advancement, and practical effectiveness of the present invention are unmistakable.

To enable a further understanding of said objectives, structures, characteristics, and effects, as well as the technology and methods used in the present invention and effects achieved, a brief description of the drawings is provided below followed by a detailed description of the preferred embodiments.

DETAILED DESCRIPTION OF THE PREFERRED EMBODIMENTS

The following description uses specific concrete examples to describe the embodiment modes of the present invention. Persons skilled in the related art can easily deduce other advantages and effects of the present invention from the content disclosed in the specification. The present invention can also use other different concrete embodiments to clarify its performance and applications. Each detail described in the specification can also be based on a different perspective and application, enabling various types of modifications and alterations to be carried out without deviating from the spirit of the present invention.

Figure 1:
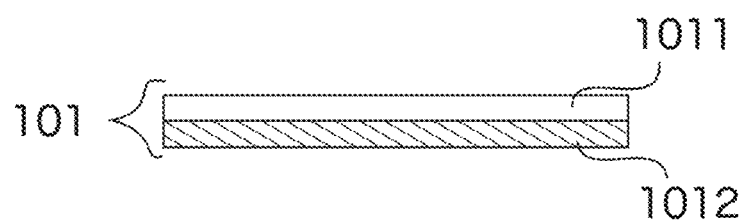
FIG. 1 shows a structural view of a single layer thin board of a heat dissipation conductive flexible board of the present invention.

Referring first to FIG. 1, which shows a structural view of a single layer thin board of a heat dissipation conductive flexible board of the present invention, and shows the heat dissipation conductive flexible board of the present invention having an assembly comprising: at least a single layer thin board 101, the structure of which comprises: a first conductive thin layer 1011, having a thickness that lies between 0.1 micrometers~5 millimeters that is laminated to a first functional thin layer 1012, and is at least a ceramic material, graphene material, or a glue material. The glue material is chosen from polymer materials, including at least epoxy, silicone resin or silicone gel, and acrylic.

Figure 2:
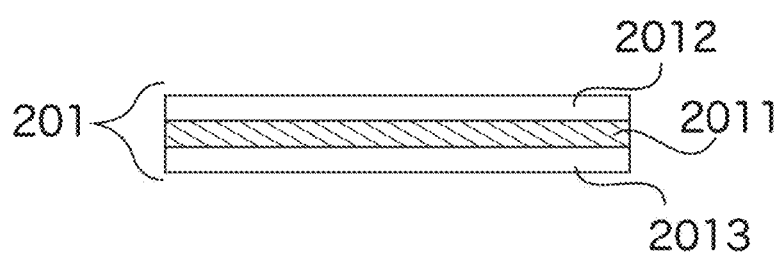
FIG. 2 shows a structural view of a double layer thin board of the heat dissipation conductive flexible board of the present invention.

FIG. 2 shows a structural view of a double layer thin board of the heat dissipation conductive flexible board of the present invention, depicting at least one double layer thin board 201, the structure of which includes: a second conductive thin layer 2011, having a thickness that lies between 0.1 micrometers~5 millimeters that is laminated between a second functional thin layer 2012 and a third functional thin layer 2013. The second functional thin layer 2012 is a ceramic material, graphene material, or a glue material; and the third functional thin layer 2013 is a ceramic material, graphene material, or a glue material. The glue material is chosen from polymer materials, including at least epoxy, silicone resin or silicone gel, and acrylic.

Figure 3:
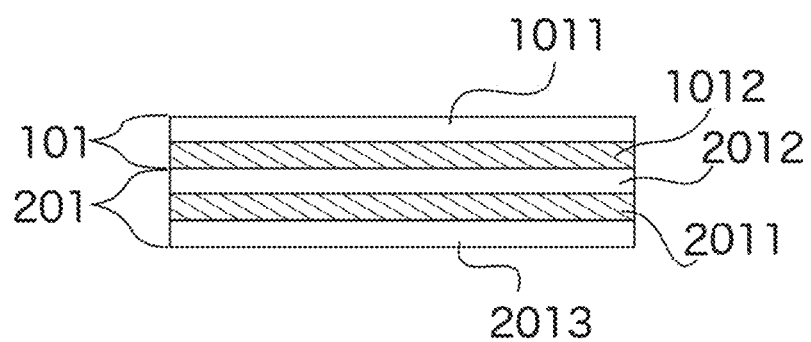
FIG. 3 shows a structural view of the heat dissipation conductive flexible board of the present invention with the single layer thin board laminated to the double layer thin board.

Structurally laminating the single layer thin board 101 to the double layer thin board 201 shown in FIGS. 1 and 2 produces the heat dissipation conductive flexible board of the present invention with the single layer thin board 101 laminated to the double layer thin board 201, as structurally shown in FIG. 3. The defining characteristics of the present invention include using at least a spraying, coating and printing method to manufacture the single layer thin board 101 and the double layer thin board 201, after which the single layer thin board 101 and the double layer thin board 201 are laminated together to form the heat dissipation conductive flexible board having a multi-layer conductive structure. The materials used for the first conductive thin layer 1011 and the second conductive thin layer 2011 are at least copper foil, aluminum foil, silver paste, carbon nanotubes, electrically conductive ink, tin paste, or copper paste. The first conductive thin layer 1011 and the second conductive thin layer 2011 are provided with electrically conducting circuit patterns to enable electrical conductance. At least the first functional thin layer 1012, the second functional thin layer 2012, or the third functional thin layer 2013 is a ceramic material, the thickness of which is 0.1~100 micrometers. At least the first functional thin layer 2012, the second functional thin layer 2012, or the third functional thin layer 2013 is a graphene material, the thickness of which is 0.1~150 micrometers. At least the first functional thin layer 2012, the second functional thin layer 2012, or the third functional thin layer 2013 is a glue material, the thickness of which is 0.1~100 micrometers. The single layer thin board 101 and the double layer thin board 201 are laminated together using a large area reel to reel configuration or sheet to sheet configuration; moreover, the width of the reel material or the sheet material is greater than or equal to 125 millimeters, 125 millimeters being the width measurements for the stable production of ceramic plates of the prior art. Hence, the present invention is able to cover the width measurements of ceramic substrates of the prior art, and can be set to cover width measurements greater than those of prior art ceramic substrates. The total thickness of the heat dissipation conductive flexible board is greater than or equal to 25 micrometers. The structure and method of the present invention enables simple and convenient combining of multi-layer composite heat dissipation sheets; furthermore, the 5 millimeter thickness of the first conductive thin layer 1011 and the second conductive thin layer 2011 also enable producing relatively thick and large composite heat dissipation sheets.

Figure 4:
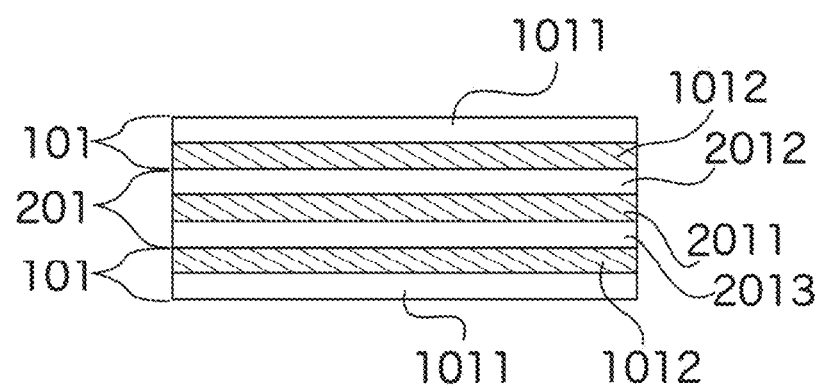
FIG. 4 shows a structural view of the heat dissipation conductive flexible board of the present invention with two of the single layer thin boards laminated to the double layer thin board.

In order for the review committee to further understand the practical applications of the present invention, examples of the application area of the multi-layer heat dissipation conductive flexible board are described below. Referring to FIG. 4, which shows a structural view of the heat dissipation conductive flexible board of the present invention with two of the single layer thin boards 101 laminated to the double layer thin board 201, thereby providing a three-layer conductive thin layer. The second conductive thin layer 2011 is sandwiched between two of the first conductive thin layers 1011, forming a modularized structure. The first conductive thin layer 1011 and the second conductive thin layer 2011 are copper foils with etched circuits or at least aluminum foil, silver paste, carbon nanotubes, electrically conductive ink, tin paste, or copper paste with etched circuits. And a sprayed or printed circuit method is used to respectively fix conductive circuits on the surfaces of the first functional thin layer 1012 and the second functional thin layer 2012. The single layer thin board 101 and the double layer thin board 201 are characterized in enabling arbitrary assembly thereof. The first functional thin layer 1012 is a ceramic material or graphene material, which have a high efficiency heat dissipation characteristic. The second functional thin layer 2012 and the third functional thin layer 2013 are glue material, which enable gluing the two single layer thin boards 101 to the double layer thin board 201. The present invention uses a reel to reel method to manufacture the single layer thin board 101 and the double layer thin board 201 having large dimensions, only requiring direct gluing together to enable further boring of holes or using laser engraving to manufacture a multi-layer heat dissipation conductive flexible board. Assembly of the multi-layer heat dissipation conductive flexible board can use an arbitrary assembling or laminating method, providing a highly flexible manufacturing process. The present invention enables combining multiple layers of the single layer thin board 101 and the double layer thin board 201, and compared to existing flexible substrates, the finish products therefrom are provided with increased thinness efficacy, with each of the functional layers made from heat dissipation material, thereby basically eliminating the need to add additional heat dissipation modules to all the heat generating electronic components, while still enabling heat energy to dissipate from between the layers. Furthermore, because of its flexible characteristic, the present invention can be rolled up to form a coiled material, enabling rolling up to the required structural shape of a product. With the functional layers being made from ceramic material, the heat conduction conductive flexible board of the present invention is a composite conductive flexible substrate that has high voltage resistance, can be arbitrarily flexed, and the main body has a high heat dissipation effect.

Based on the drawings shown in FIGS. 3 and 4, holes can be further drilled in the configurations shown to allow injecting conductive materials therein, such as at least silver paste, carbon nanotubes, electrically conductive ink, tin paste, or copper paste, thereby connecting each of the conductive thin layers by allowing conduction of electric current therebetween. The present invention enables the manufacture of large area heat dissipation conductive flexible boards, which after post processing, can be arbitrarily cut into smaller sized heat dissipation conductive flexible boards. And because of the pre-etched conductive circuit layout prior to completing the manufacture of the heat dissipation conductive flexible board, and because each of the functional layers is made from heat dissipation material, the need to add additional heat dissipation modules to all the heat generating electronic components is basically eliminated, thus enabling further miniaturization of electronic devices. Hence, the present invention has optimal feasible application in all flexible substrate application in future 5G, 6G high radio frequency electronic communication devices, vehicle electronic components, and microwave transmitter/receiver use. The manufacturing process comprises a functional combination of a plasma machine, a spraying machine, a printing machine, and a tunnel oven, whereby a copper coil is uncoiled to carry out surface plasma processing, after which spraying of a first functional thin layer, a second functional thin layer, or a third functional thin layer is carried out. Each of the functional thin layers are then placed in a tunnel oven for hardening thereof, and finally coiled up to form the single layer thin board 101 and the double layer thin board 201. The conductive circuit design can use a spraying, coating, or a printing method to form the first functional thin layer, the second functional thin layer, or the third functional thin layer; a carrier method can also be additionally used to form conductive circuit patterns. Compared to the thickness of traditional glass fiber boards and polyimide flexible substrates, the structure of the present invention is relatively thinner, and is also provided with the heat dissipation functional layers as well as the characteristic of high voltage resistance that will not easily breakdown. Accordingly, the present invention eliminates the need to additionally install cooling fins or graphite paper, which would otherwise increase the load-bearing of the heat generating electronic components. The voltage resistance of the heat dissipation conductive flexible board of the present invention is higher than that compared to traditional copper substrates. The voltage resistance of the first functional thin layer 1012, the second functional thin layer 2012, and the third functional thin layer 2013, all made from ceramic material with a thickness of 0.1~150 micrometers, was tested and had a voltage resistance of 500V~20 KV. Furthermore, the heat dissipation conductive flexible board can be directly cut and applied as composite cooling fins, wherein the non-functional edges of the composite cooling fins are exposed to the external environment to provide heat dissipation areas required for heat dissipation. The heat dissipation conductive flexible board can also be directly cut and applied as bendable three-dimensional composite cooling fins, wherein the non-functional edges of the bendable three-dimensional composite cooling fins are exposed to the external environment to provide heat dissipation areas required for three-dimensional heat dissipation.

The present invention further provides a structure and method that uses a reel to reel method or sheet to sheet method to produce large area heat dissipation conductive flexible boards, which resolves the complicated manufacturing process of the prior art involving laminating and contrapositioning of traditional polyimide flexible substrate materials, and improves production rate. The single layer thin board 101 and the double layer thin board 201 of the present invention are provided with the characteristics to enable achieving fast customization and free combination laminating, which accommodates small-volume large-variety industrial requirements. In addition, the production process uses at least a spraying, coating, or printing method to produce a single layer thin board and a double layer thin board, which has the advantages of increasing the speed of the production process and simplifying the manufacturing process, thereby distinguishing and differentiating it from the prior art. Accordingly, the originality, advancement, and practical effectiveness of the present invention are unmistakable, and enable effective improvements on the shortcomings of prior art, as well as having considerable practicability in use.

In conclusion, the specific structures of the embodiments disclosed in the present invention certainly have the characteristics to enable providing the basis for arbitrary laminating of the single layer thin board 101 to the double layer thin board 201, and enable manufacturing large area heat dissipation conductive flexible boards using a reel to reel production process. Furthermore, the overall structure of the present invention has not been seen in like products, and the contents of this specification have not been publicly disclosed prior to this application. The practicability and advancement of the present invention clearly comply with the essential elements as required for a new patent application, accordingly, a new patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A heat dissipation conductive flexible board, having an assembly comprising:
at least a single layer thin board, wherein the single layer thin board has a first functional thin layer and a first conductive thin layer, the first functional thin layer is a ceramic material, graphene material or a glue material, a thickness of the first conductive thin layer is between 0.1 micrometers-5 millimeters, and the first conductive thin layer is laminated to the first functional thin layer; and
at least one double layer thin board, wherein the double layer thin board having a second functional thin layer, a third functional thin layer and a second conductive thin layer, wherein the second functional thin layer is a ceramic material, graphene material, or a glue material, the third functional thin layer is a ceramic material, graphene material, or a glue material, a thickness of the second conductive thin layer is between 0.1 micrometers-5 millimeters, and the second conductive thin layer is laminated between the second functional thin layer and the third functional thin layer,
wherein the single layer thin board and the double layer thin board are manufactured by using a spraying, coating, or printing method, and the single layer thin board and the double layer thin board are laminated together to form the heat dissipation conductive flexible board having a multi-layer conductive structure, and
wherein the first conductive thin layer and the second conductive thin layer are silver paste, carbon nanotubes, electrically conductive ink, tin paste, or copper paste.

2. The heat dissipation conductive flexible board according to claim 1, wherein the first conductive thin layer and the second conductive thin layer are provided with current conducting circuit patterns to enable electron channeling.

3. The heat dissipation conductive flexible board according to claim 1, wherein at least the first functional thin layer, the second functional thin layer, or the third functional thin layer is a ceramic material, a thickness of the ceramic material is 0.1-150 micrometers.

4. The heat dissipation conductive flexible board according to claim 1, wherein at least the first functional thin layer, the second functional thin layer, or the third functional thin layer is a graphene material, a thickness of the graphene material is 0.1-150 micrometers.

5. The heat dissipation conductive flexible board according to claim 1, wherein at least the first functional thin layer, the second functional thin layer, or the third functional thin layer is a glue material, a thickness of the glue material is 0.1-100 micrometers.

6. The heat dissipation conductive flexible board according to claim 1, wherein the single layer thin board and the double layer thin board use a large area reel to reel configuration or sheet to sheet configuration for laminating, a width of a coil material or sheet material is greater than or equal to 125 millimeters.

7. The heat dissipation conductive flexible board according to claim 1, wherein a total thickness of the heat dissipation conductive flexible board is greater than or equal to 25 micrometers.

\* \* \* \* \*